United States Patent
Kang

(10) Patent No.: US 11,144,380 B2
(45) Date of Patent: Oct. 12, 2021

(54) MEMORY CONTROLLER AND STORAGE DEVICE INCLUDING THE SAME

(71) Applicant: Samsung Electronics Co., Ltd., Suwon-si (KR)

(72) Inventor: Nam-wook Kang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 203 days.

(21) Appl. No.: 16/414,079

(22) Filed: May 16, 2019

(65) Prior Publication Data

US 2020/0104201 A1  Apr. 2, 2020

(30) Foreign Application Priority Data

Oct. 1, 2018 (KR) .................. 10-2018-0117106

(51) Int. Cl.
  *G06F 11/30* (2006.01)
  *G06F 11/07* (2006.01)
  *G06F 11/34* (2006.01)

(52) U.S. Cl.
  CPC .......... *G06F 11/079* (2013.01); *G06F 11/076* (2013.01); *G06F 11/0727* (2013.01); *G06F 11/0793* (2013.01); *G06F 11/3034* (2013.01); *G06F 11/3495* (2013.01)

(58) Field of Classification Search
  CPC ............... G06F 11/079; G06F 11/0793; G06F 11/3495; G06F 11/3034; G06F 11/76; G06F 11/727; G06F 3/0653; G06F 11/3485; G06F 11/3037; G11C 29/52; G11C 29/70; G11C 2029/0409
  See application file for complete search history.

(56) References Cited

U.S. PATENT DOCUMENTS

| | | | |
|---|---|---|---|
| 7,464,306 B1 | 12/2008 | Furuhjelm et al. | |
| 8,341,332 B2 | 12/2012 | Ma et al. | |
| 9,286,176 B1 | 3/2016 | Tomlin et al. | |
| 9,317,350 B2 | 4/2016 | Cher et al. | |
| 9,349,476 B2* | 5/2016 | Pe'er | G11C 11/5628 |
| 9,443,616 B2* | 9/2016 | Chen | G11C 29/44 |
| 9,449,717 B2* | 9/2016 | Becker | G06F 11/008 |
| 9,471,428 B2 | 10/2016 | Chinnakkonda Vidyapoornachary et al. | |
| 9,613,708 B1* | 4/2017 | Hsieh | G11C 29/021 |
| 2006/0129899 A1* | 6/2006 | Cochran | G06F 11/106 |
| | | | 714/718 |
| 2013/0173972 A1 | 7/2013 | Kubo | |
| 2016/0092120 A1 | 3/2016 | Liu | |
| 2016/0241361 A1 | 8/2016 | Silva | |
| 2017/0110183 A1* | 4/2017 | Chung | G06F 3/0653 |
| 2017/0117056 A1* | 4/2017 | Park | G11C 16/10 |

(Continued)

FOREIGN PATENT DOCUMENTS

KR    20190020229 A    2/2019

*Primary Examiner* — Yolanda L Wilson
(74) *Attorney, Agent, or Firm* — Harness, Dickey & Pierce, P.L.C.

(57) ABSTRACT

A storage device includes a non-volatile memory including a plurality of memory groups; and a memory controller configured to determine a monitoring group from among the plurality of memory groups, determine a monitoring block from among a plurality of blocks included in the monitoring group, and determine whether the monitoring group is a fail group by monitoring the monitoring block using dummy data prior to failure of the monitoring group.

18 Claims, 17 Drawing Sheets

(56) References Cited

U.S. PATENT DOCUMENTS

2017/0185463 A1* 6/2017 Kim .................. G06F 11/076
2019/0057041 A1  2/2019 Ha et al.
2020/0233739 A1* 7/2020 Oh .................... G06F 3/0619

* cited by examiner

EXCEPTION TABLE

| DIE | READ FAIL | PROGRAM FAIL | ERASE FAIL |
|---|---|---|---|
| 0 | 45 | 20 | 5 |
| 1 | 10 | 0 | 0 |
| 2 | 1 | 0 | 0 |
| ... | | | |
| m | 2 | 1 | 0 |

DIE STATUS TABLE

| DIE | WHETHER DIE IS FAIL DIE | WHETHER DIE IS MONITORING DIE |
|---|---|---|
| 0 | No | Yes |
| 1 | No | No |
| 2 | No | No |
| ... | | |
| m | No | No |

BLOCK STATUS TABLE

| BLOCK | STATUS | WHETHER BLOCKS ARE HEALTHY BLOCKS |
|---|---|---|
| 0 | VALID | YES |
| 1 | BAD | NO |
| 2 | VALID | YES |
| 3 | VALID | YES |
| 4 | BAD | NO |
| 5 | VALID | YES |
| 6 | BAD | NO |
| 7 | VALID | YES |
| 8 | FREE | YES |
| 9 | FREE | YES |
| 10 | FREE | YES |
| 11 | RESERVED | YES |
| 12 | RESERVED | YES |
| 13 | RESERVED | YES |

MEMORY CONTROLLER AND STORAGE DEVICE INCLUDING THE SAME

CROSS-REFERENCE TO RELATED APPLICATION

This application claims the benefit of Korean Patent Application No. 10-2018-0117106, filed on Oct. 1, 2018, in the Korean Intellectual Property Office, the disclosure of which is incorporated herein in its entirety by reference.

BACKGROUND

Example embodiments the inventive concepts relate to a storage device. For example, at least some example embodiments relate to a memory controller capable of detecting in advance a fail group and/or a storage device including the memory controller.

A flash memory, as a non-volatile memory, may retain stored data even when power is turned off. Recently, storage devices including the flash memory such as a solid state drive (SSD), a memory card, etc. have been widely used. Some non-volatile memories may be exposed to progressive failures due to a variety of causes, and accordingly, some of dies included in the non-volatile memories may be determined as fail dies or failure dies. Here, the fail die may refer to a die that is incapable of performing block replacement with a reserved block in the die since the number of bad blocks generated in the die exceeds a reference number.

SUMMARY

Example embodiments of the inventive concepts provide a memory controller capable of detecting in advance a fail group included in a non-volatile memory device and/or a storage device including the memory controller.

According to an example embodiment of the inventive concepts, there is provided a storage device including a non-volatile memory including a plurality of memory groups; and a memory controller configured to, determine a monitoring group from among the plurality of memory groups, determine a monitoring block from among a plurality of blocks included in the monitoring group, and determine whether the monitoring group is a fail group by monitoring the monitoring block using dummy data prior to failure of the monitoring group.

According to another example embodiment of the inventive concepts, there is provided a memory controller including a memory; and a processor configured to, determine a monitoring group from among a plurality of memory groups, the monitoring group including one or more of bad blocks and healthy blocks, determine a monitoring block from among a plurality of blocks included in the monitoring group, monitor the monitoring block to determine whether the monitoring block is one of the bad blocks or one of the healthy blocks, determine whether the monitoring group is a fail group based on a number of the bad blocks included in the monitoring group, and allocate one of the healthy blocks as a user block for a memory operation on user data.

According to another example embodiment of the inventive concepts, there is provided a memory controller including a memory storing a plurality of block status tables corresponding to different ones of a plurality of memory groups; and a processor configured to, determine a monitoring group from among the plurality of memory groups, determine a monitoring block from among a plurality of blocks included in the monitoring group, monitor the monitoring block using dummy data to generate a result, update a first block status table corresponding to the monitoring group from among the plurality of status block tables based on the result, and determine whether the monitoring group is a fail group based on the first block status table prior to failure of the monitoring group.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
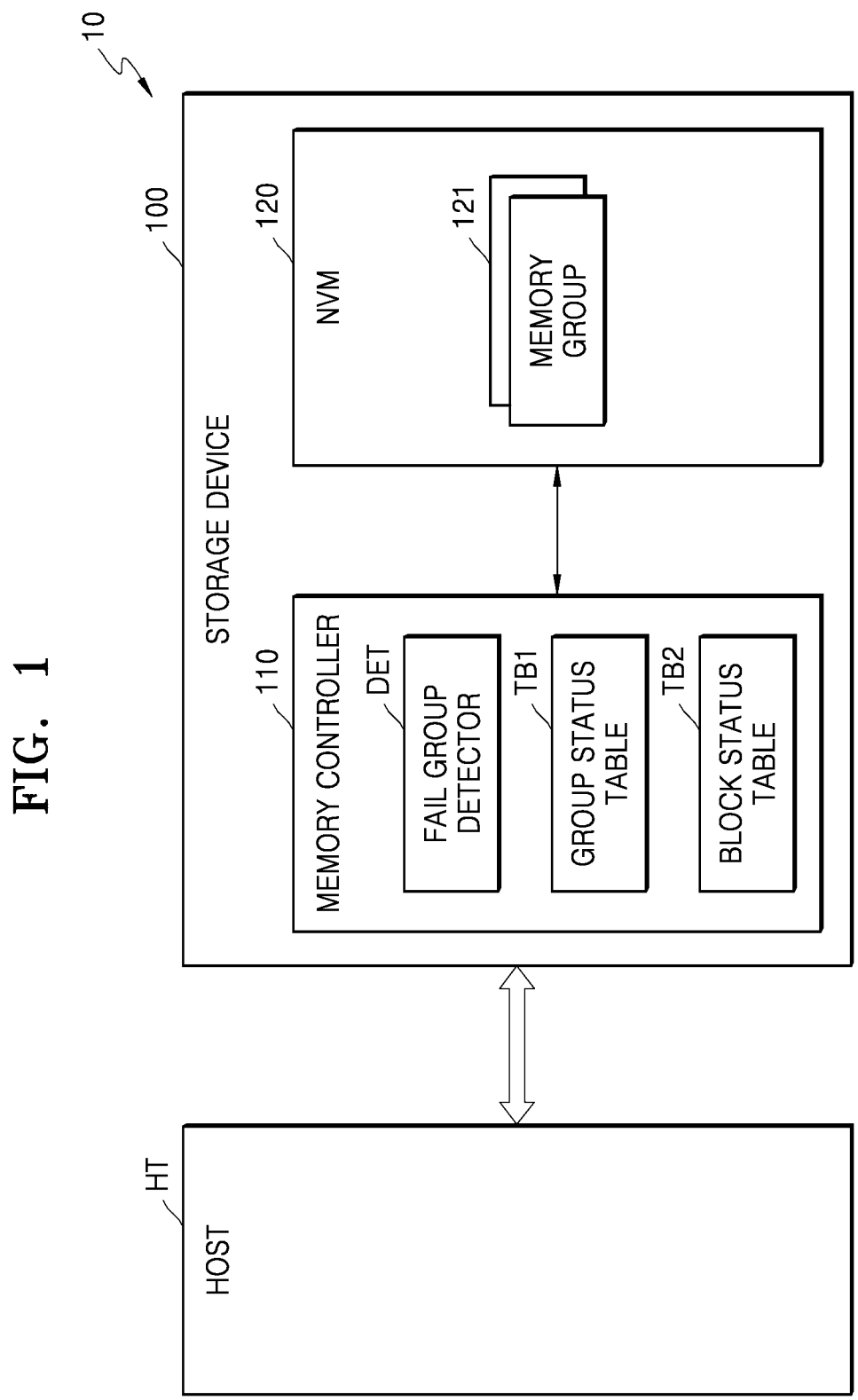
FIG. 1 is a block diagram illustrating a storage system according to an example embodiment of the inventive concepts.

FIG. 1 is a block diagram illustrating a storage system 10 according to an example embodiment of the inventive concepts.

Referring to FIG. 1, the storage system 10 may include a storage device 100 and a host HT. The storage device 100 may include a memory controller 110 and a non-volatile memory (NVM) 120. The memory controller 110 may include a fail group detector DET, a group status table TB1 and a block status table TB2. For example, as discussed below with reference to FIGS. 3 and 4, the memory controller 110 may include a processor that executes computer readable instructions to convert the processor into a special purpose processor to perform the functions of the fail group detector, and a memory that stores the aforementioned tables. Hereinafter, the memory controller 110 will be referred to as a "controller" for convenience.

The host HT may communicate with the storage device 100 through various interfaces. For example, the host HT may be implemented as an application processor (AP) or a system-on-chip (SoC). Also, for example, the host HT may be implemented as an integrated circuit, a motherboard, or a database server, but is not limited thereto. The host HT may send a write request or a read request to the storage device 100. The storage device 100 may write data to the NVM 120 or read the data from the NVM 120 in response to the write request or the read request.

The NVM 120 may include a plurality of memory groups 121. Each of the plurality of memory groups 121 may include a plurality of memory blocks (hereinafter referred to as "blocks"). Each of the plurality of blocks may include a plurality of pages. Each of the plurality of pages may include a plurality of memory cells. For example, a block may be a unit of erase, and a page may be a unit of write and read. In some example embodiments, the plurality of memory groups 121 may include a plurality of memory chips, a plurality of dies, or a plurality of planes. In an example embodiment, the NVM 120 may include a flash memory device, for example, a NAND flash memory device. However, the inventive concepts are not limited thereto. The NVM 120 may include a resistive memory device such as a resistive RAM (ReRAM), a phase change RAM (PRAM), and a magnetic RAM (MRAM).

The controller 110 may control the NVM 120 and may detect in advance a fail group from among the plurality of memory groups 121. The fail group detector DET may detect a memory group having a high fail possibility and monitor the memory group detected in advance before one of the plurality of memory groups 121 is determined as the fail group. Hereinafter, the memory group detected in advance by the fail group detector DET will be referred to as a "monitoring group".

The fail group detector DET may determine a monitoring block among a plurality of blocks included in the monitoring group. In an example embodiment, the fail group detector DET may determine, as the monitoring block, a block that does not include a valid page on which valid data is programmed among the plurality of blocks. For example, the monitoring block may be a reserved block (e.g., 241a in FIG. 2) or a free block (e.g., 241b in FIG. 2).

The fail group detector DET may perform a monitoring operation on the monitoring block. In an example embodiment, the fail group detector DET may use dummy data to perform the monitoring operation on the monitoring block. In an example embodiment, the monitoring operation may perform the memory operation including at least one of an erase operation, a program operation, and a read operation on the monitoring block, and may include an operation of determining whether the monitoring block is a bad block based on a result of performing the memory operation.

The fail group detector DET may determine in advance whether the monitoring group is a fail group based on the result of performing the monitoring operation. In an example embodiment, the fail group detector DET may determine in advance whether the monitoring group is the fail group based on the number of bad blocks included in the monitoring group.

The fail group detector DET may manage the group status table TB1 for the plurality of memory groups 121. The group status table TB1 may store information about whether each of the plurality of memory groups 121 is the fail group or the monitoring group. In an example embodiment, the fail group detector DET may update the group status table TB1 according to a result of determining the monitoring group. In an example embodiment, the fail group detector DET may change the monitoring group to the fail group based on the result of performing the monitoring operation on the monitoring block.

Also, the fail group detector DET may manage the block status table TB2 for a plurality of blocks included in each memory group. The block status table TB2 may store information about whether the plurality of blocks are bad blocks. In an example embodiment, the fail group detector DET may determine the monitoring block as the bad block or a healthy block by performing the monitoring operation on the monitoring block, and may update a result of determining in the block status table TB2. Also, the fail group detector DET may determine whether the monitoring group is the fail group based on the block status table TB2.

For example, the group status table TB1 and the block status table TB2 may be loaded into an internal memory (for example, 112 in FIG. 3) in the controller 110. Although the group status table TB1 and the block status table TB2 are included in the controller 110 in FIG. 1, example embodiments of the inventive concepts are not limited thereto. In some example embodiments, at least one of the group status table TB1 and the block status table TB2 may be loaded into a memory chip, for example, a Dynamic Random Access Memory (DRAM) chip (for example, 130 in FIG. 4) outside a controller chip in which the controller 110 is implemented.

The storage system 10 may be implemented, for example, as a personal computer (PC), a data server, a network-coupled storage, an Internet of Things (IoT) device, or a portable electronic device. The portable electronic device may be a laptop computer, a mobile phone, a smart phone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, a wearable device, or the like.

In some example embodiments, the storage device 100 may be an internal memory embedded in an electronic device. For example, the storage device 100 may be an SSD, an embedded Universal Flash Storage (UFS) memory device, or an embedded Multi-Media Card (eMMC). In some example embodiments, the storage device 100 may be an external memory removable from the electronic device. For example, the storage device 100 may be a UFS memory card, a Compact Flash (CF) card, a Secure Digital (SD) card, a Micro Secure Digital (Micro-SD) card, a Mini Secure Digital (Mini-SD) card, an extreme Digital (xD) card or a memory stick.

Figure 2:
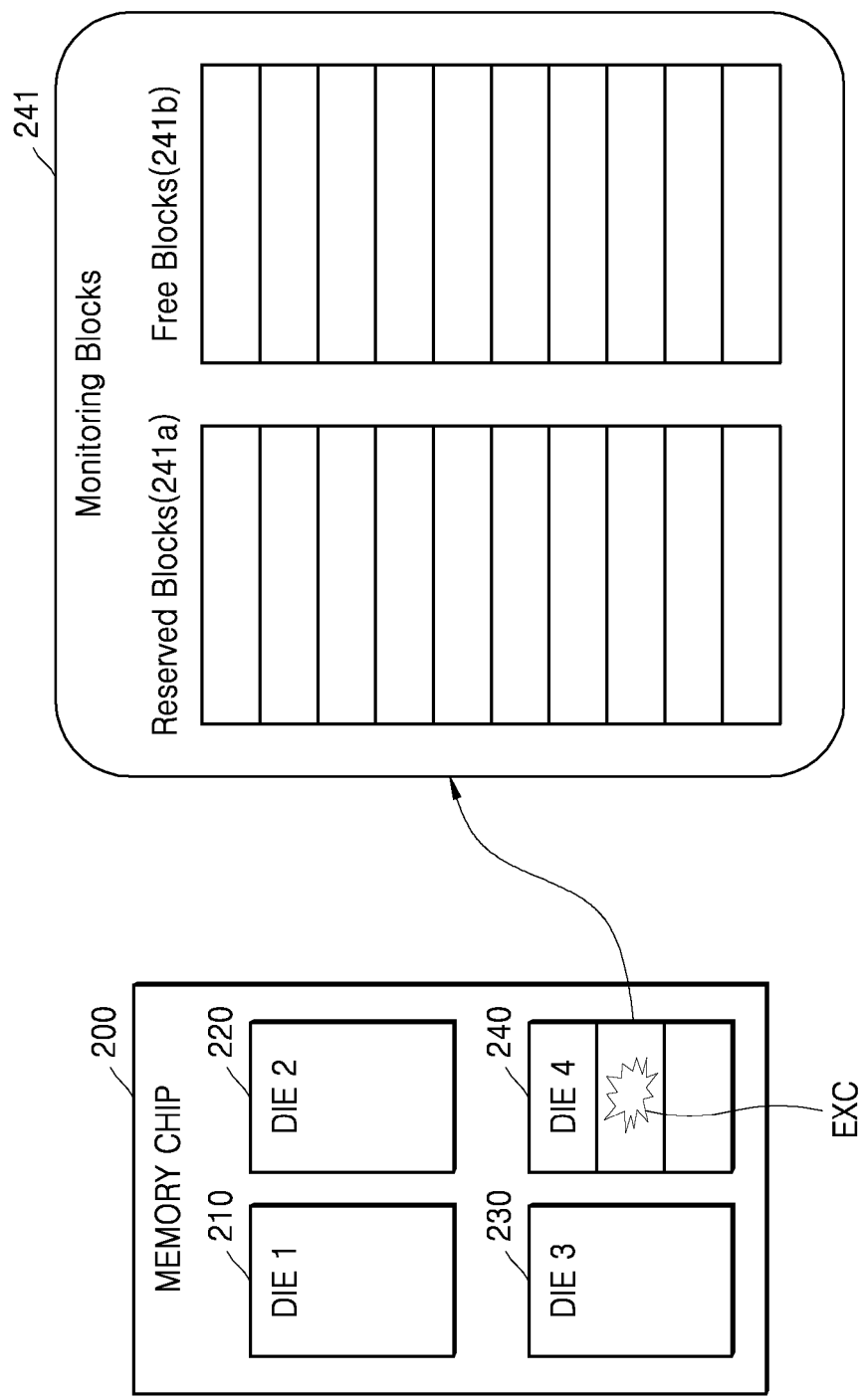
FIG. 2 illustrates examples of monitoring blocks according to an example embodiment of the inventive concepts.

FIG. 2 illustrates examples of monitoring blocks 241 according to an example embodiment of the inventive concepts.

Referring to FIG. 2, a memory chip 200 may include first to fourth dies 210 to 240. For example, the memory chip 200 may be an example of the NVM 120 of FIG. 1, and the first to fourth dies 210 to 240 may be examples of the plurality of memory groups 121 shown in FIG. 1. For example, when an exception EXC of more than a reference number occurs in the fourth die 240 among the first to fourth dies 210 to 240, the fourth die 240 may be determined as a monitoring die. For example, the exception EXC may include an erase fail, a program fail, and a read fail.

In an example embodiment, the fourth die 240 may be determined as the monitoring die when successive fails with respect to the memory operation occur in the fourth die 240. According to example embodiments, a threshold number of successive fails before a die is determined as a monitoring die may vary. For example, when two fails occur consecutively in the fourth die 240, the fourth die 240 may be determined as the monitoring die. As another example, when more than three fails occur in the fourth die 240 consecutively, the fourth die 240 may be determined as the monitoring die.

In an example embodiment, when the number of fails with respect to the memory operation in the fourth die 240 is greater than or equal to the reference number, the fourth die 240 may be determined as the monitoring die. For example, when the number of fails with respect to the memory operation in the fourth die 240 is equal to or greater than a first reference value and is equal to or less than a second reference value that is greater than the first reference value, then the fourth die 240 may be determined as the monitoring die. For example, when the number of fails with respect to the memory operation in the fourth die 240 is greater than the second reference value, the fourth die 240 may be determined as a fail die.

Among a plurality of blocks included in the fourth die 240, the monitoring blocks 241 may be determined. In an example embodiment, the monitoring blocks 241 may include reserved blocks 241a. Here, the reserved blocks 241a may refer to predefined blocks for block replacement with a bad block. In an example embodiment, the monitoring blocks 241 may include free blocks 241b. Here, the free blocks 241b may refer to blocks that do not store valid user data. For example, the free blocks 241b may be blocks on which an erase operation is completely performed and may be blocks capable of performing the program operation again. In an example embodiment, the monitoring blocks 241 may include both the reserved blocks 241a and the free blocks 241b.

Figure 3:
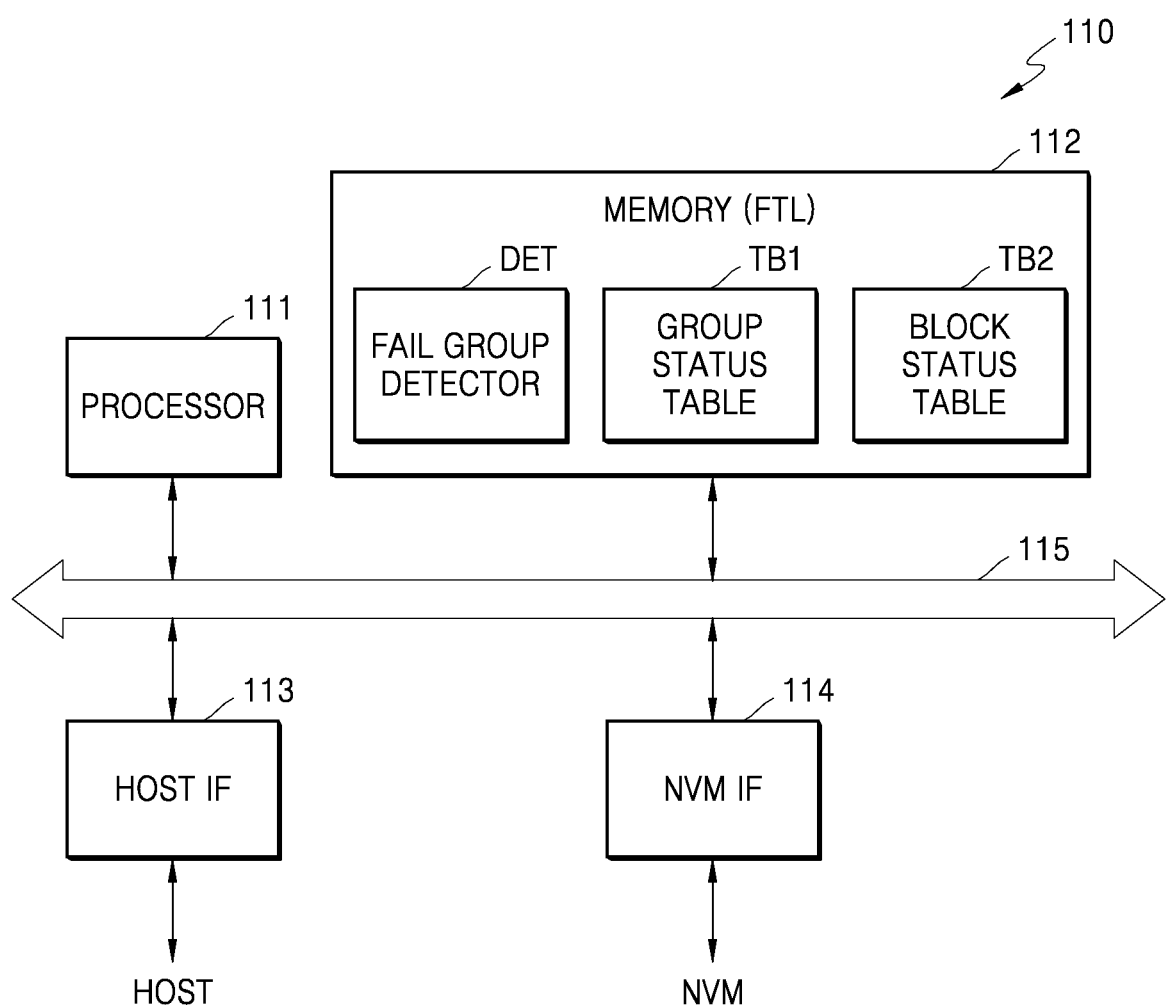
FIG. 3 is a block diagram illustrating a memory controller according to example an example embodiment of the inventive concepts.

FIG. 3 is a block diagram illustrating the memory controller 110 according to an example embodiment of the inventive concepts.

Referring to FIGS. 1 and 3, the memory controller 110 may include a processor 111, a memory 112, a host interface 113, and a non-volatile memory interface 114, which may communicate with each other via a bus 115. The processor 111 may include a central processing unit, a microprocessor, and the like, and may control the overall operation of the controller 110. In an example embodiment, the processor 111 may be implemented as a multi core processor, for example, a dual core processor or a quad core processor.

The memory 112 may operate under the control of the processor 111, and may be used as an operation memory, a buffer memory, a cache memory, and the like. For example, the memory 112 may be implemented as a volatile memory such as DRAM, SRAM, or a non-volatile memory such as a PRAM or a flash memory.

The memory 112 may store a Flash Translation Layer (FTL) code that may be executed by the processor 111. In some example embodiments, upon booting, the FTL code may be loaded into the memory 112 from the NVM 120 such that the memory 112 may be loaded with the fail group detector DET, the group status table TB1, and the block status table TB2. The fail group detector DET may be implemented as firmware or software and may be loaded into the memory 112.

In some example embodiments, the processor 111 may execute the FTL code stored in the memory 112 to convert the processor 111 into a special purpose processor to perform the functions of the fail group detector DET such that the processor 111 performs the operations illustrated in FIG. 5, discussed below. Therefore, the processor 111 may improve the functioning of the storage system 10 itself by detecting a fail group in advance of failure, thereby reducing the probability of failure, by preferably allocating healthy blocks, and reducing the amount of data to migrate between a bad block and one of the healthy blocks upon failure by storing dummy data in the monitoring blocks.

However, example embodiments of the inventive concepts are not limited thereto. In some example embodiments, the fail group detector DET may be implemented as hardware or may be disposed outside the memory 112.

The host interface 113 may provide an interface between the host HT and the controller 110 according to, for example, Universal Serial Bus (USB), MMC, PCI-Express (PCI-E), AT Attachment (ATA), Serial AT Attachment (SATA), Parallel AT Attachment (PATA), Small Computer System Interface (SCSI), Serial Attached SCSI (SAS), Enhanced Small Disk Interface (ESDI), Integrated Drive Electronics (IDE), etc.

The non-volatile memory interface 114 may provide an interface between the controller 110 and the NVM 120. For example, metadata such as the group status table TB1, the block status table TB2, or a mapping table, write data, and read data may be transmitted and received between the controller 110 and the NVM 120 via the non-volatile memory interface 114. In an example embodiment, the number of non-volatile memory interfaces 114 may correspond to the number of non-volatile memory chips included in the storage device 100 or the number of channels between the controller 110 and the NVM 120.

Figure 4:
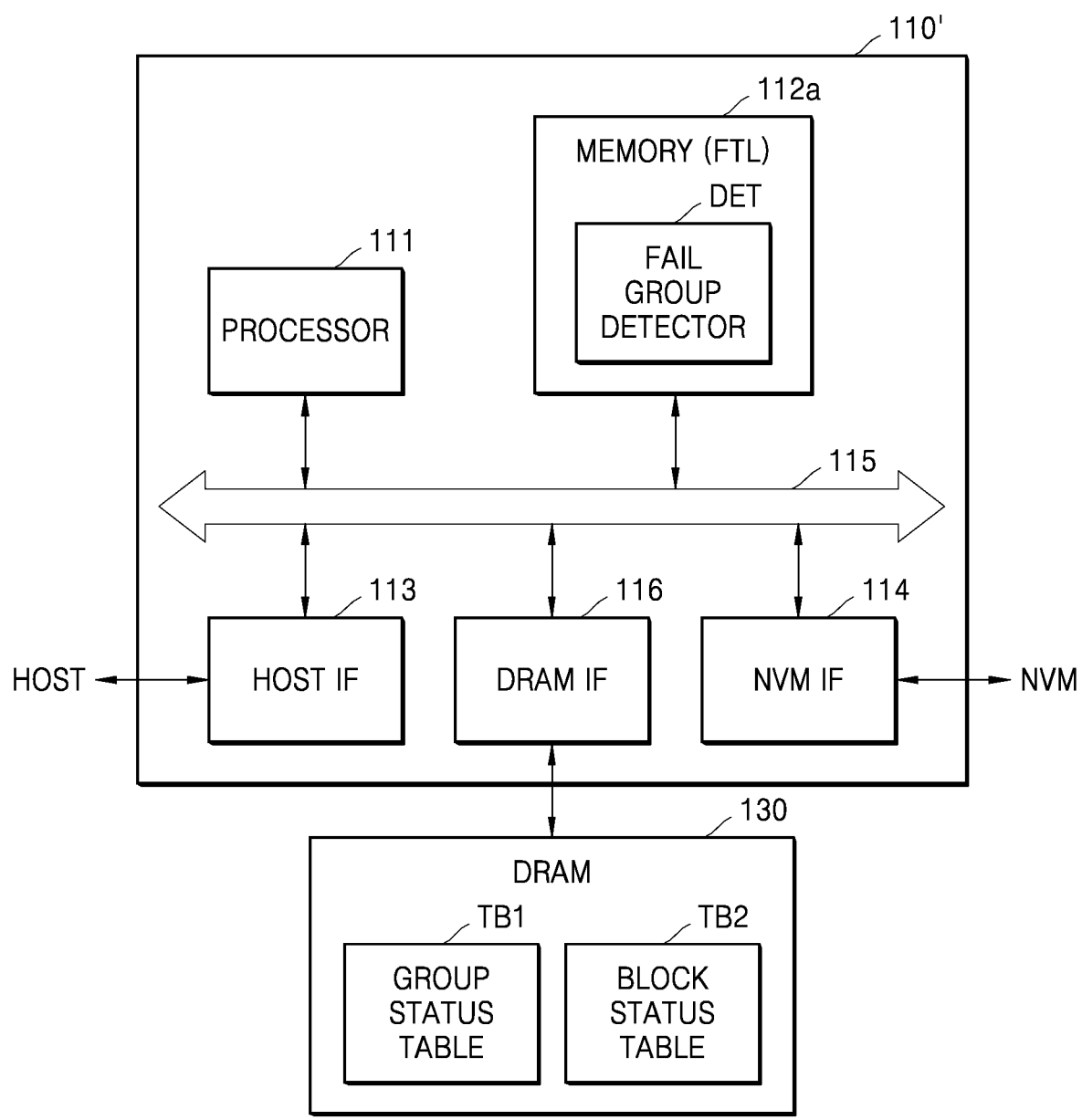
FIG. 4 is a block diagram illustrating a memory controller according to an example embodiment of the inventive concepts.

FIG. 4 is a block diagram illustrating a memory controller 110' according to an example embodiment of the inventive concepts.

Referring to FIG. 4, the memory controller 110' may include the processor 111, a memory 112a, the host interface 113, the non-volatile memory interface 114 and a DRAM interface 116, which may communicate with each other via the bus 115. The controller 110' according to the present example embodiment may correspond to a modified example of the controller 110 of FIG. 3, and thus a redundant description thereof will be omitted. According to the present example embodiment, the group status table TB1 and the block status table TB2 may be loaded into the DRAM chip 130. The DRAM interface 116 may provide an interface between the controller 110' and the DRAM chip 130. For example, some data included in the group status table TB1 and the block status table TB2 may be transmitted and received between the controller 110' and the DRAM chip 130 via the DRAM interface 116.

Figure 5:
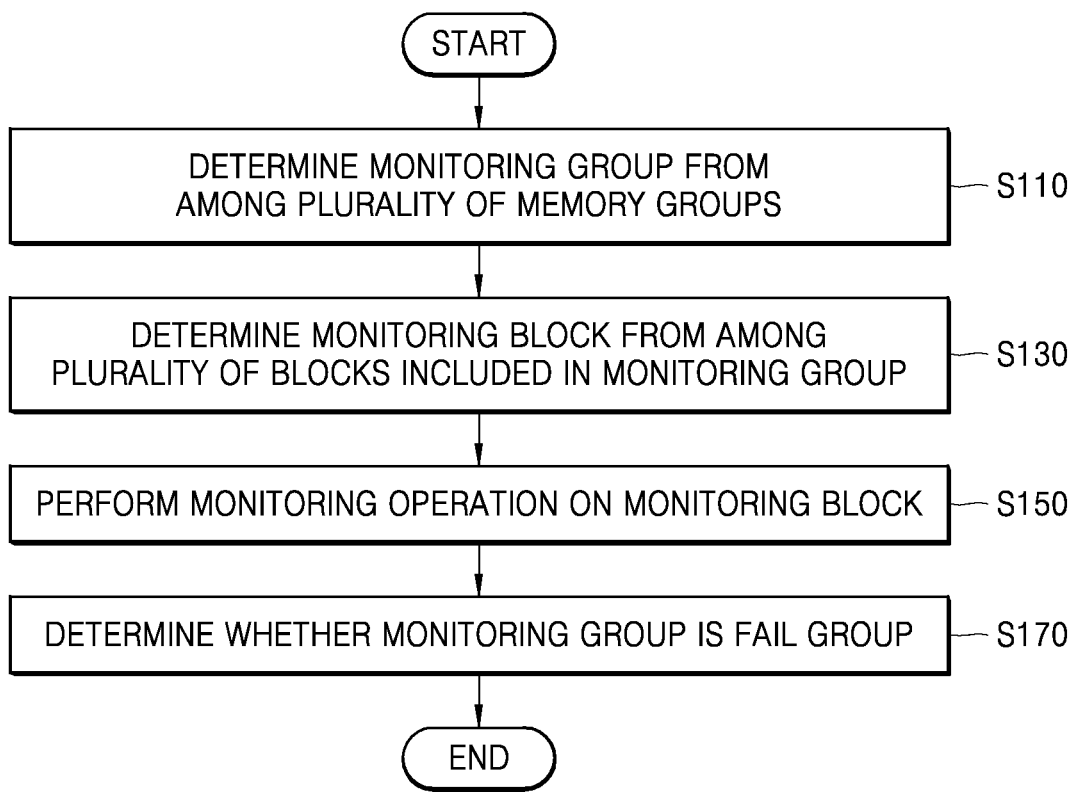
FIG. 5 is a flowchart illustrating a method of detecting in advance a fail group according to an example embodiment of the inventive concepts.

FIG. 5 is a flowchart illustrating a method of detecting in advance a fail group according to an example embodiment of the inventive concepts.

Referring to FIG. 5, the method of detecting in advance the fail group according to the present example embodiment may be a method of detecting in advance (e.g., prior to failure) a memory group having a high possibility of fail before the fail group occurs among a plurality of memory groups, and may include, for example, operations time serially performed by the memory controller 110 of FIG. 1. Hereinafter, the method of detecting in advance the fail group according to the present example embodiment will be described with reference to FIGS. 1 and 5.

In operation S110, a monitoring group may be determined among a plurality of memory groups. For example, the controller 110 may determine a memory group having the number of fails or exceptions equal to or greater than a fail reference number among the plurality of memory groups 121 included in the NVM 120, as the monitoring group. Also, the controller 110 may update the group status table TB1 according to a result of determining the monitoring group. For example, the controller 110 may periodically or non-periodically monitor the exception or the number of fails occurring in the plurality of memory groups 121. Hereinafter, operation S110 will be described in more detail with reference to FIG. 6.

Figure 6:
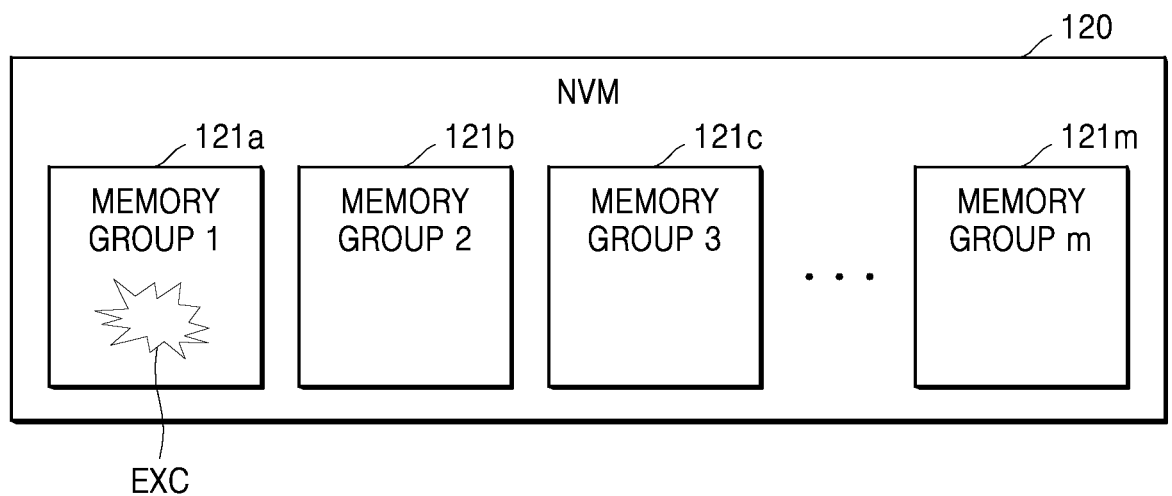
FIG. 6 illustrates an example of an operation of determining a monitoring group according to an example embodiment of the inventive concepts.

FIG. 6 illustrates an example of an operation of determining a monitoring group according to an example embodiment of the inventive concepts.

Referring to FIGS. 1 and 6 together, the NVM 120 may include first through m-th memory groups 121a through 121m. Here, m is a positive integer. At this time, the exception EXC may occur in the first memory group 121a, and the fail group detector DET may determine the first memory group 121a as the monitoring group. According to example embodiments, the number of monitoring groups may vary. In some example embodiments, a plurality of memory groups may be determined as monitoring groups.

Referring again to FIG. 5, in operation S130, a monitoring block may be determined among a plurality of blocks included in the monitoring group. For example, the controller 110 may determine, based on the block status table TB2, at least one block in which no valid user data is stored among the plurality of blocks included in the monitoring group, as the monitoring block. Hereinafter, operation S130 will be described in more detail with reference to FIG. 7.

Figure 7:
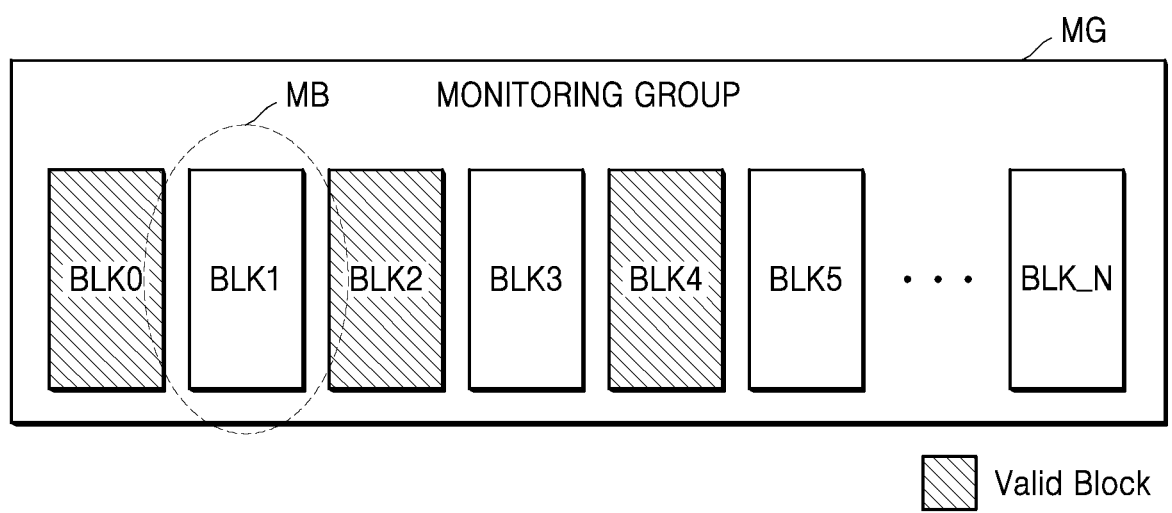
FIG. 7 illustrates an example of an operation of determining a monitoring block according to an example embodiment of the inventive concepts.

FIG. 7 illustrates an example of an operation of determining a monitoring block MB according to an example embodiment of the inventive concepts.

Referring to FIGS. 1 and 7, a monitoring group MG may include a plurality of blocks BLK0 to BLK_N. Here, N is a positive integer. For example, the monitoring group MG may be the first memory group 121a of FIG. 6. For example, some blocks BLK0, BLK2, and BLK4 of the plurality of blocks BLK0 to BLK_N may be valid blocks including a valid page in which valid user data is stored. The fail group detector DET may determine at least one block, for example, the block BLK1, which does not include the valid page, among the plurality of blocks BLK0 to BLK_N as the monitoring block MB. However, the inventive concepts are not limited thereto. In some example embodiments, the plurality of blocks BLK1, BLK3, BLK5, BLK_N may be determined as monitoring blocks.

Referring again to FIG. 5, in operation S150, a monitoring operation may be performed on the monitoring block. For example, the controller 110 may perform the monitoring operation on the monitoring block by performing the memory operation including at least one of an erase operation, a program operation, and a read operation. For example, the controller 110 may perform the monitoring operation periodically or non-periodically on the monitoring block. Hereinafter, operation S150 will be described in more detail with reference to FIG. 8A.

Figure 8A:
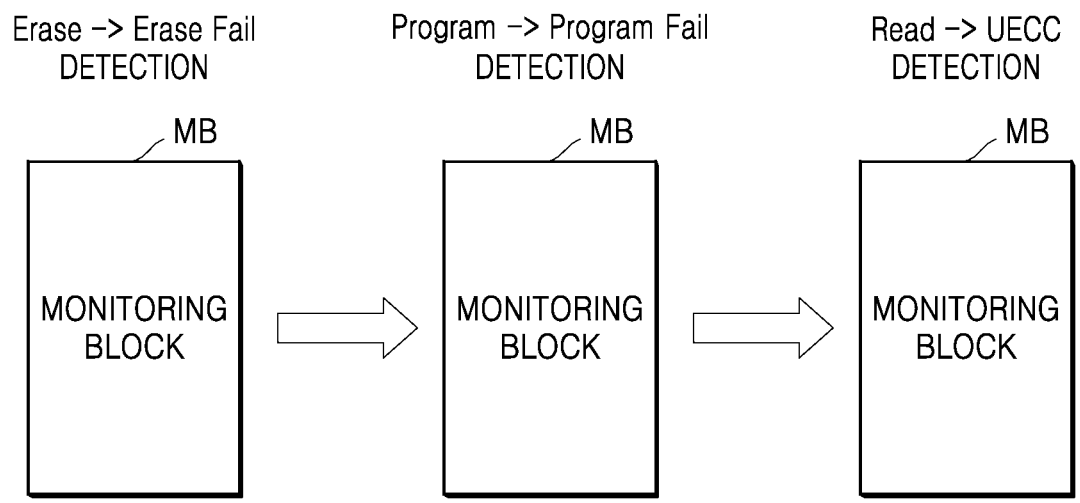
FIG. 8A illustrates an example of a monitoring operation performed on a monitoring block according to an example embodiment of the inventive concepts and FIG. 8B illustrates an example of a status determination operation performed on a monitoring block according to an example embodiment of the inventive concepts.

FIG. 8A illustrates an example of a monitoring operation performed on the monitoring block MB according to an example embodiment of the inventive concepts.

Referring to FIG. 8A, the monitoring operation performed on the monitoring block MB may include an erase operation, a program operation, and a read operation which are sequentially performed. First, the erase operation may be performed on the monitoring block MB, and then an erase verification operation may be performed to determine a pass/fail of the erase operation on the monitoring block MB, and update an erase fail result (for example, a number of erase fails) to an exception table (for example, 300 in FIG. 10A). For example, when the erase fail result exceeds a reference number, the monitoring group may be determined as a fail group.

Next, the program operation may be performed on the monitoring block MB using dummy data, and then a program verification operation may be performed to determine a pass/fail of the program operation on the monitoring block MB and update a program fail result (for example, a number of program fails) to the exception table. For example, when the program fail result exceeds a reference number, the monitoring group may be determined as the fail group. In an example embodiment, the program operation may be performed on all pages included in the monitoring block MB. In an example embodiment, the program operation may be performed on some pages included in the monitoring block MB.

Next, the read operation may be performed on the monitoring block MB, and then a read verification operation may be performed to determine a pass/fail of the read operation on the monitoring block MB, and update a read fail result (for example, a number of read fails) to the exception table. For example, when the read fail result exceeds a reference number, the monitoring group may be determined as the fail group. At this time, as a result of the read verification operation, an error that may not be corrected using an Error Correction Code (ECC) may be referred to as an Uncorrectable Error Correction Code (UECC) error.

Referring again to FIG. 5, in operation S170, it may be determined whether the monitoring group is a fail group. For example, the controller 110 may perform the monitoring operation on the monitoring block to determine whether the monitoring block is a bad block. Also, for example, the controller 110 may determine whether the monitoring group is the fail group, based on the number of bad blocks included in the monitoring group. Hereinafter, operation S170 will be described in more detail with reference to FIG. 8B.

Figure 8B:
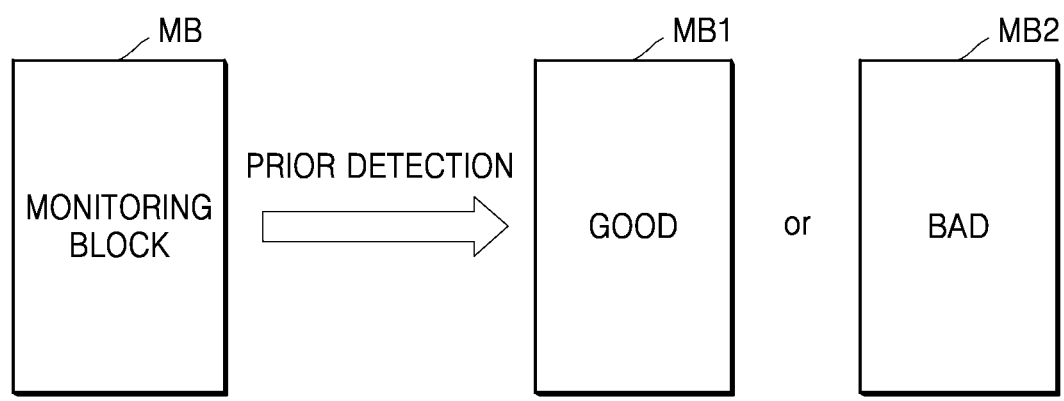

FIG. 8B illustrates an example of a status determination operation performed on the monitoring block MB according to an example embodiment of the inventive concepts.

Referring to FIG. 8B, a status of the monitoring block MB may be determined to be good or bad based on a result of performing the monitoring operation on the monitoring block MB. In other words, the monitoring block MB may be determined as a good block MB1 or a bad block MB2. Hereinafter, the good block MB1 will be referred to as a "healthy block". Then, a status determination result of the monitoring block MB may be updated to a block status table (for example, 600 in FIG. 14).

Figure 9:
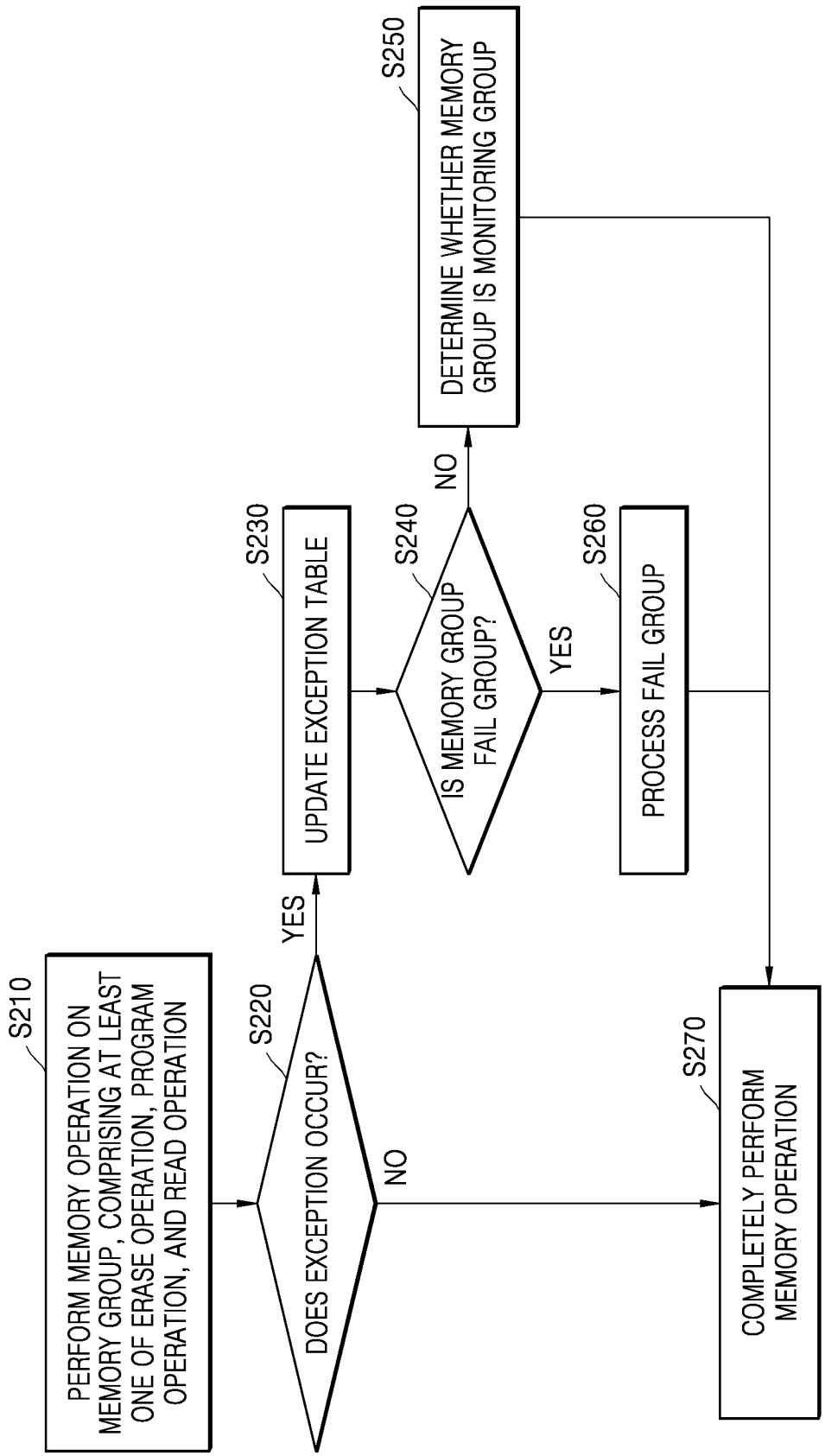
FIG. 9 is a flowchart illustrating a method of determining a monitoring group according to an example embodiment of the inventive concepts.

FIG. 9 is a flowchart illustrating a method of determining a monitoring group according to an example embodiment of the inventive concepts.

Referring to FIG. 9, the method of determining the monitoring group according to the present example embodiment may include, for example, a plurality of operations time serially performed by the storage device 100 of FIG. 1. For example, the monitoring method according to the present example embodiment may correspond to an example of operation S110 in FIG. 5. Hereinafter, the method of determining the monitoring group will be described with reference to FIGS. 1 and 9.

In operation S210, the storage device 100 may perform a memory operation including at least one of erasing, programming and reading on the memory group. In an example embodiment, the memory operations may include various input/output operations of the NVM 120 performed in response to a write request or a read request from the host HT. However, the inventive concepts are not limited thereto. In some example embodiments, the memory operation may include various input/output operations of the NVM 120, for example, background operations, according to a control operation of the controller 110. In some example embodiments, the memory operation according to operation S210 may include a verification operation including at least one of an erase verification operation, a program verification operation, and a read verification operation on the memory group.

In operation S220, the controller 110 may determine whether an exception has occurred as a result of performing the memory operation. Here, the "exception" may include an erase fail, a program fail, and a read fail.

When the controller 110 determines that an exception has not occurred, in operation S270, the memory operation may be completed. Then, the controller 110 may transmit a response message indicating that the memory operation has been completed to the host HT.

In contrast, when the controller 110 determines that the exception has occurred, operation S230 may be performed.

In operation S230, the controller 110 may update an exception table. Hereinafter, the exception table will be described with reference to FIG. 10A.

Figure 10A:
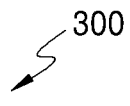
FIG. 10A illustrates an example of an exception table according to an example embodiment of the inventive concepts and FIG. 10B illustrates an example of a die status table according to an example embodiment of the inventive concepts.

FIG. 10A illustrates an example of an exception table 300 according to an example embodiment of the inventive concepts.

Referring to FIG. 10A, the exception table 300 may store the number of read fails, the number of program fails, and the number of erase fails with respect to each of a plurality of memory groups, for example, a plurality of dies. When the number of read fails, the number of program fails, the number of erase fails, or their sum exceeds a reference number with respect to one of the plurality of dies, the die may be determined as a fail die. For example, the exception table 300 may be loaded into the memory 112 of FIG. 3 or the DRAM chip 130 of FIG. 4.

Referring again to FIG. 9, in operation S240, the controller 110 may determine whether the memory group is a fail group. As a result of determination, when the memory group is the fail group, fail group processing may be performed on the memory group in operation S260. For example, fail group processing may be "Fail-In-Place (FiP)" processing. Specifically, FiP may refer to an operation of mapping a logical address corresponding to a fail die to a logical address of another region (e.g., another die) and migrating data.

On the other hand, as a result of determination, when it is determined that the memory group is not the fail group, operation S250 may be performed. In operation S250, the controller 110 may determine whether the memory group is a monitoring group. In some example embodiments, the operation of determining the monitoring group according to operation S250 may include an operation of updating the group status table TB1 according to the result of determination. Hereinafter, a die status table will be described as an example of the group status table TB1 with reference to FIG. 10B.

Figure 10B:

FIG. 10B illustrates an example of a die status table 400 according to an example embodiment of the inventive concepts.

Referring to FIG. 10B, the die status table 400 may store information indicating whether each die is a fail die. For example, when it is determined in operation S240 of FIG. 9 that the die is the fail die, the die may be updated to the fail die in the die status table 400. For example, when it is determined that the die is the fail die, FiP processing may be performed.

Also, the die status table 400 may store information indicating whether each die is a monitoring die. For example, as a result of performing operation S250 in FIG. 9, when it is determined that the die is the monitoring die, the die may be updated to the monitoring die in the die status table 400. For example, when it is determined that the die is the monitoring die, a monitoring operation may be performed on a monitoring block. For example, the die status table 400 may be loaded into the memory 112 of FIG. 3 or the DRAM chip 130 of FIG. 4.

Figure 11:
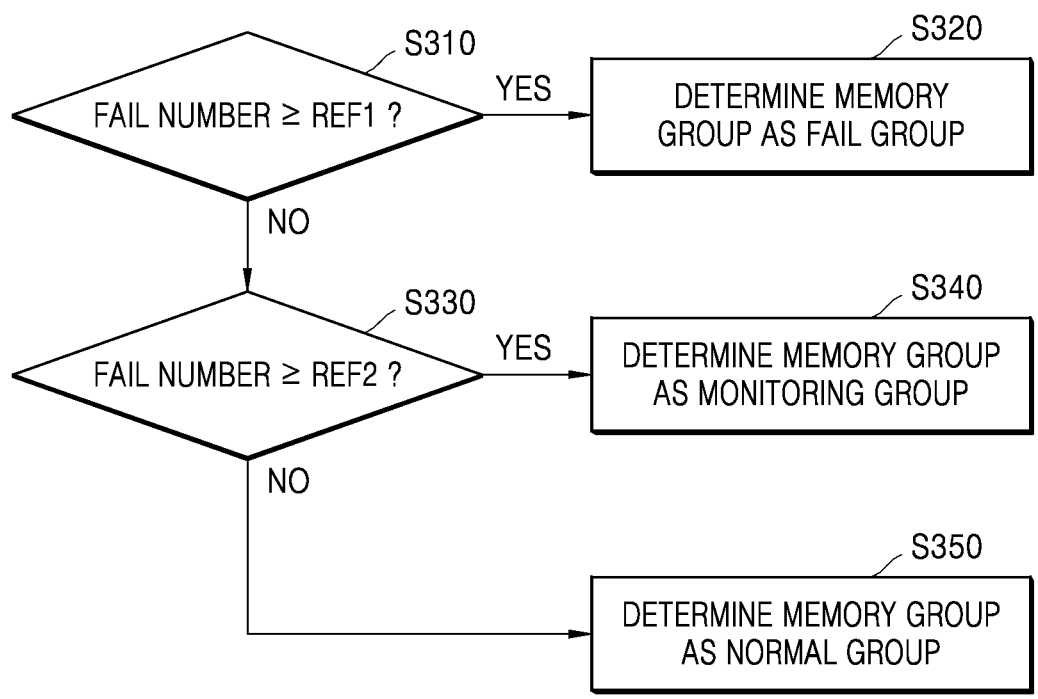
FIG. 11 is a flowchart illustrating in more detail a method of determining a monitoring group according to an example embodiment of the inventive concepts.

FIG. 11 is a flowchart illustrating in more detail a method of determining a monitoring group according to an example embodiment of the inventive concepts.

Referring to FIG. 11, the method of determining the monitoring group according to the present example embodiment may correspond to an implementation example of operations S240 and S250 of FIG. 9. In operation S310, the controller 110 may determine whether the number of fails is equal to or greater than a first reference number REF1. For example, the number of fails may correspond to the number of read fails, the number of program fails, the number of erase fails, or their sum in the exception table 300 of FIG. 10A. As a result of determination, when the number of fails is equal to or greater than the first reference number REF1, the memory group may be determined as a fail group in operation S320.

Meanwhile, when it is determined that the number of fails is smaller than the first reference number REF1, in operation S330, the controller 110 may determine whether the number of fails is greater than or equal to a second reference number REF2. Here, the second reference number REF2 may be smaller than the first reference number REF1. As a result of determination, when the number of fails is equal to or greater than the second reference number REF2, the controller 110 may determine the memory group as a monitoring group in operation S340. On the other hand, when the number of fails is smaller than the second reference number REF2 as a result of determination, the controller 110 may determine the memory group as a normal group in operation S350.

Figure 12:
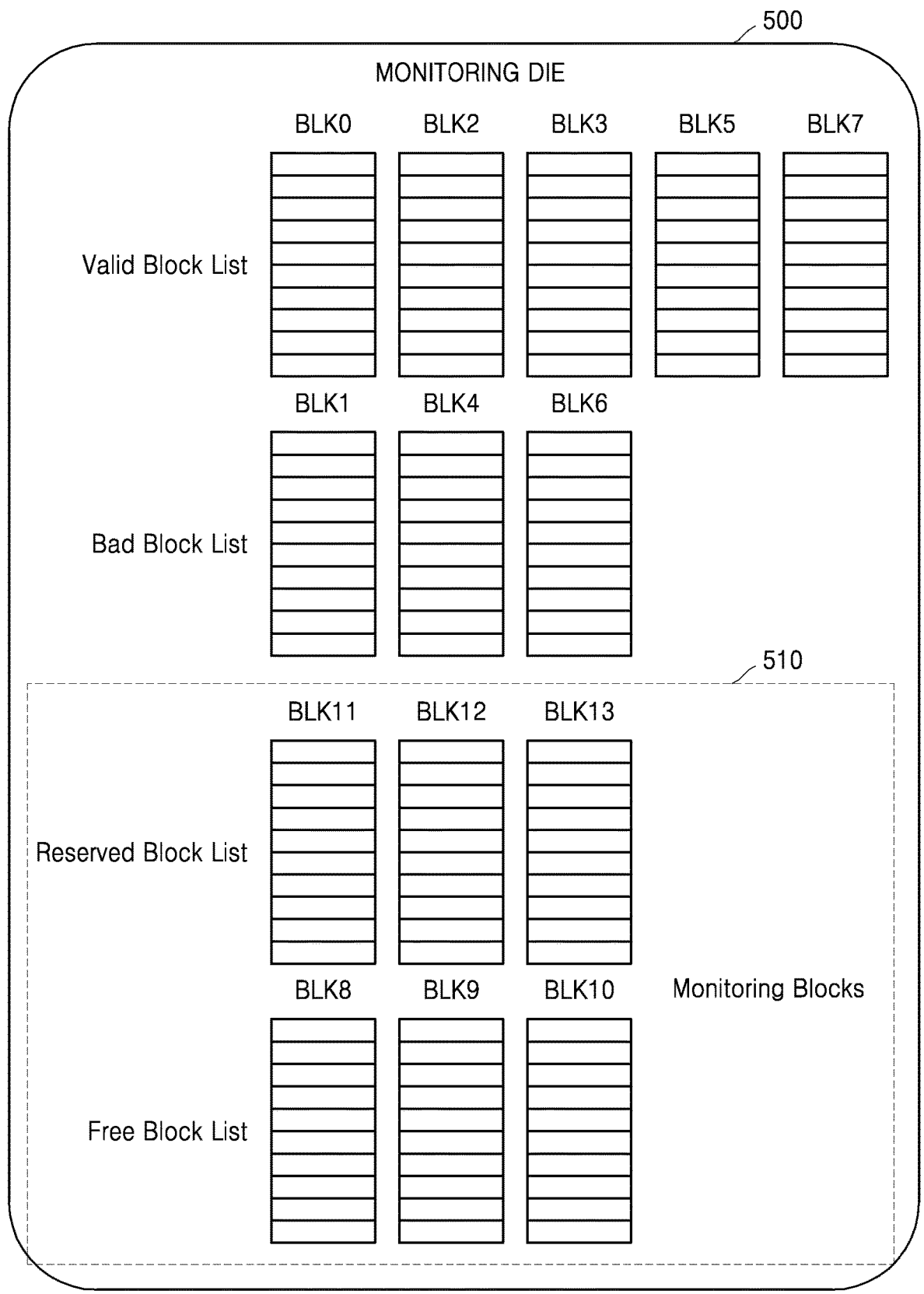
FIG. 12 illustrates an example of a monitoring die according to an example embodiment of the inventive concepts.

FIG. 12 illustrates an example of a monitoring die 500 according to an example embodiment of the inventive concepts.

Referring to FIG. 12, the monitoring die 500 may include valid blocks BLK0, BLK2, BLK3, BLK5 and BLK7, bad blocks BLK1, BLK4 and BLK6, reserved blocks BLK11, BLK12 and BLK13, and free blocks BLK8, BLK9, and BLK10. In some example embodiments, monitoring blocks 510 may include the reserved blocks BLK11, BLK12, and BLK13 and the free blocks BLK8, BLK9, and BLK10. However, example embodiments of the inventive concepts are not limited thereto. In some example embodiments, the monitoring blocks 510 may include at least one of the reserved blocks BLK11, BLK12, and BLK13 or at least one of the free blocks BLK8, BLK9, and BLK10.

Figure 13:
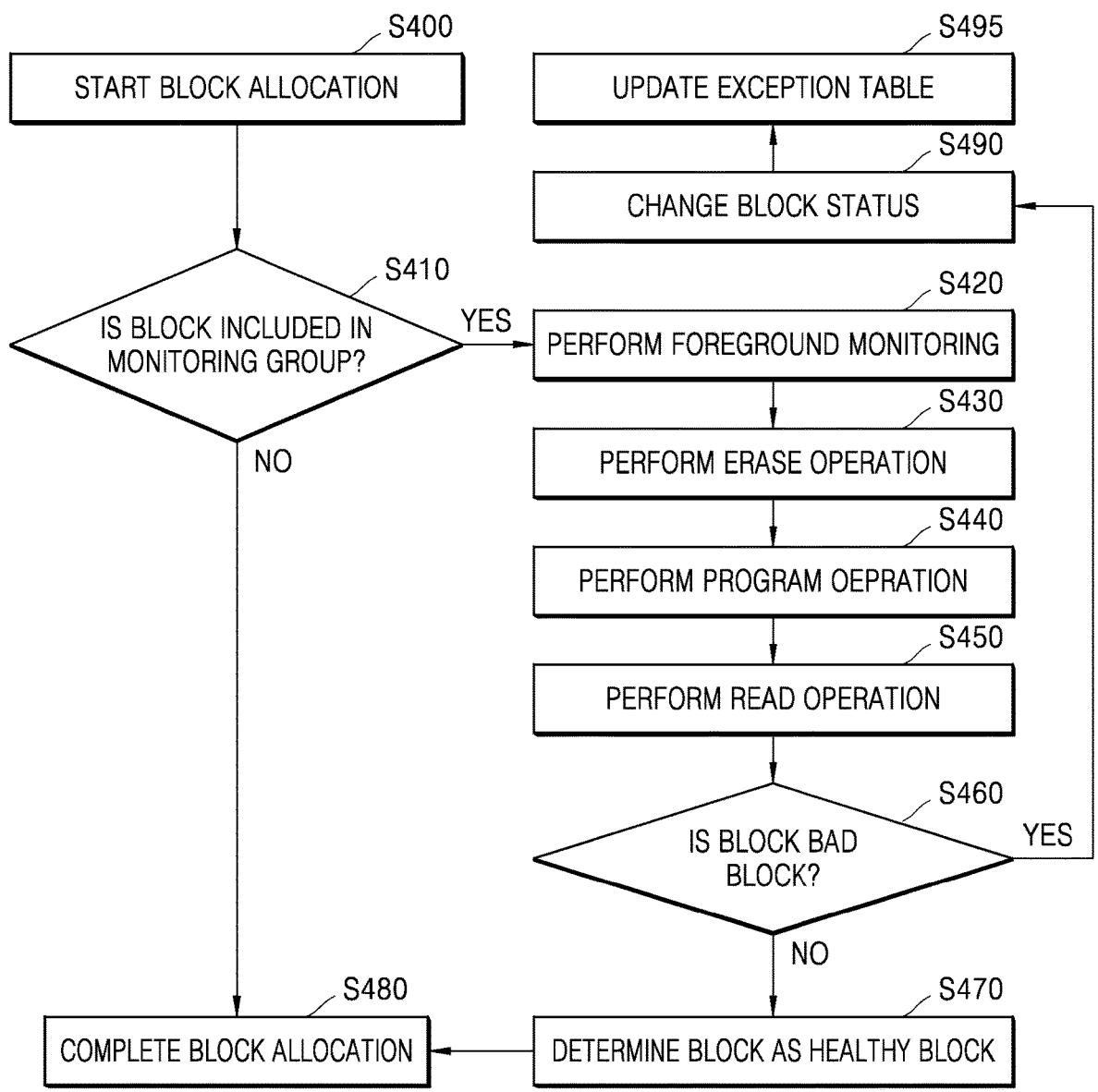
FIG. 13 is a flowchart illustrating an example of a monitoring method preformed on a monitoring block according to an example embodiment of the inventive concepts.

FIG. 13 is a flowchart illustrating an example of a monitoring method preformed on a monitoring block according to an example embodiment of the inventive concepts.

Referring to FIG. 13, the monitoring method of the present example embodiment may correspond to a foreground monitoring method performed on the monitoring block. For example, the monitoring method according to the present example embodiment may correspond to an example of operation S150 in FIG. 5. For example, the monitoring method according to the present example embodiment may include operations time serially performed by the memory controller 110 of FIG. 1. Hereinafter, the monitoring method according to the present example embodiment will be described with reference to FIGS. 1 and 13.

In operation S400, the controller 110 may start block allocation. In an example embodiment, when a write request is received from the host HT, the controller 110 may allocate a block included in one of a plurality of memory groups included in the NVM 120 as a write block. In an example embodiment, when a bad block management operation is initiated, the controller 110 may allocate the block included in one of the plurality of memory groups included in the NVM 120 as the write block. For example, the controller 110 may allocate the free block BLK8 included in the monitoring die 500 of FIG. 12 as the write block.

In operation S410, the controller 110 may determine whether the allocated block is included in the monitoring group. As a result of determination, when the block is included in the monitoring group, operation S420 may be performed. On the other hand, when it is determined that the block is not included in the monitoring group, the block allocation may be completed in operation S480. For example, the allocated block BLK8 may be determined as the write block, and in response to a write request from the host HT, user data may be programmed in the allocated block BLK8. For example, the allocated block BLK8 may be determined as the write block, and data stored in a bad block may be copied to program the copied data in the allocated block BLK8.

In operation S420, the controller 110 may proceed to foreground monitoring on the block. In operation S430, an erase operation may be performed on the block. Also, operation S430 may include an erase verification operation performed after the erase operation. In operation S440, a program operation may be performed on the block. For example, dummy data may be programmed in the block. Also, operation S440 may include a program verification operation performed after the program operation. In operation S450, a read operation may be performed on the block. Also, operation S450 may include a read verification operation performed after the read operation. For example, the dummy data programmed in the block may be read. However, example embodiments of the inventive concepts are not limited thereto. In some example embodiments, at least one of operations S430 to S450 may be performed. Further, in some example embodiments, the order of operations S430 to S450 may be changed.

In operation S460, the controller 110 may determine whether the block is a bad block. For example, the controller 110 may determine whether the block is the bad block based on at least one of a result of performing the erase verification operation, a result of performing the program verification operation, and a result of performing the read verification operation. When it is determined that the block is not the bad block, operation S470 may be performed. In operation S470, the controller 110 may determine the block as a healthy block. For example, the controller 110 may maintain a status of the block BLK8 as a free block and indicate the status of the block BLK8 as the healthy block in a block status table (for example, 600 in FIG. 14).

On the other hand, when it is determined that the block is the bad block, operation S490 may be performed. In operation S490, the controller 110 may change a block status. For example, the controller 110 may update the block status table 600 to reflect the changed block status. For example, the controller 110 may change the status of the block BLK8 to the bad block and indicate the status of the block BLK8 as a non-healthy block in the block status table 600.

In operation S495, the controller 110 may update the exception table (e.g., 300 in FIG. 10A). The controller 110 may update the exception table according to a type of a fail occurred in operations S430 to S450. For example, when an erase fail occurs, the controller 110 may update the number of erase fails in the exception table. For example, when a program fail occurs, the controller 110 may update the number of program fails in the exception table. For example, when a read fail occurs, the controller 110 may update the number of read fails in the exception table. On the other hand, when it is determined that the block is not the bad block, the controller 110 may determine the block as the healthy block in operation S470. In operation S480, the controller 110 may allocate the block determined as the healthy block.

Figure 14:
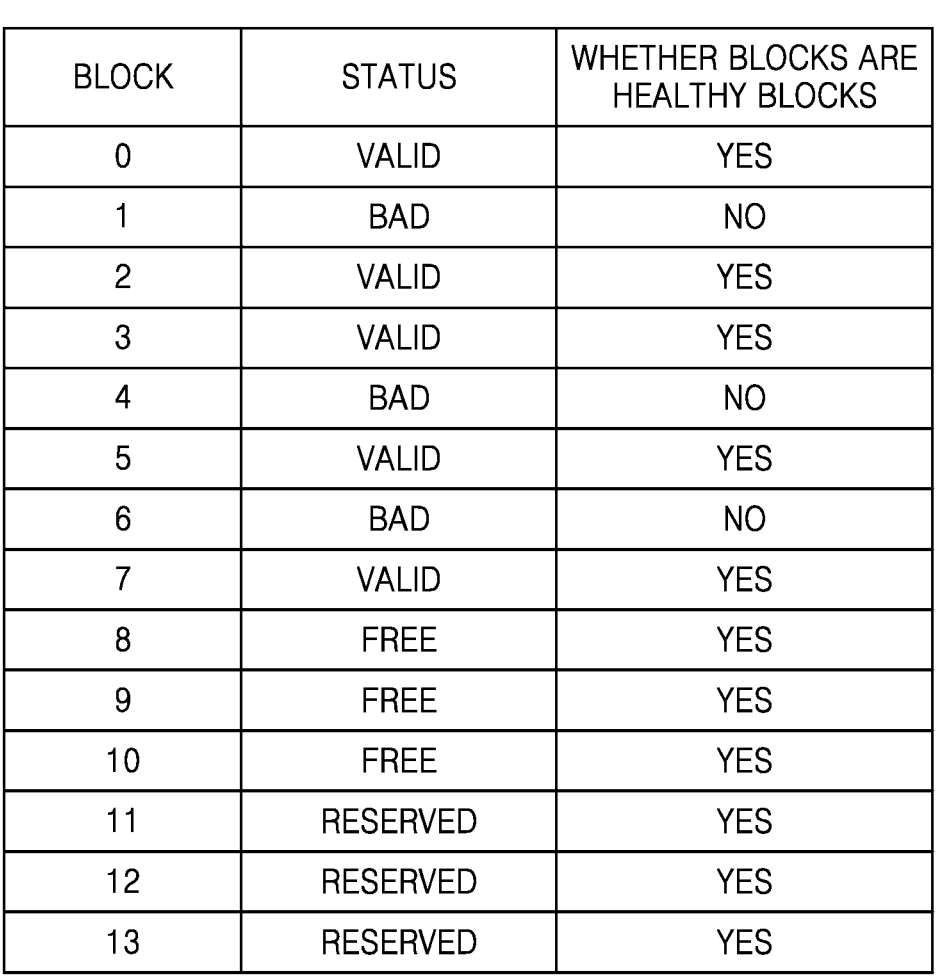
FIG. 14 illustrates an example of a block status table according to an example embodiment of the inventive concepts.

FIG. 14 illustrates an example of the block status table 600 according to an example embodiment of the inventive concepts.

Referring to FIG. 14, the block status table 600 may include status information of the plurality of blocks BLK0 to BLK13 included, for example, in the monitoring die 500 of FIG. 12. For example, the blocks BLK0, BLK2, BLK3, BLK5, and BLK7 may be indicated as valid blocks, and the blocks BLK1, BLK4, and BLK6 may be indicated as bad blocks. Also, for example, the blocks BLK11, BLK12, and BLK13 may be indicated as reserved blocks, and the blocks BLK8, BLK9, and BLK10 may be indicated as free blocks.

Also, the block status table 600 may include information indicating whether the plurality of blocks BLK0 to BLK13 are healthy blocks. The information indicating whether the plurality of blocks BLK0 to BLK13 are healthy blocks may be changed by reflecting a result of performing a monitoring operation on a monitoring block. In an example embodiment, as a result of performing the monitoring operation by programming dummy data in the monitoring block, when a program fail occurs, the monitoring block may be determined as a non-healthy block, i.e., a bad block. On the other hand, as a result of performing the monitoring operation by programming dummy data in the monitoring block, when the program fail does not occur, the monitoring block may be determined as the healthy block.

Figure 15:
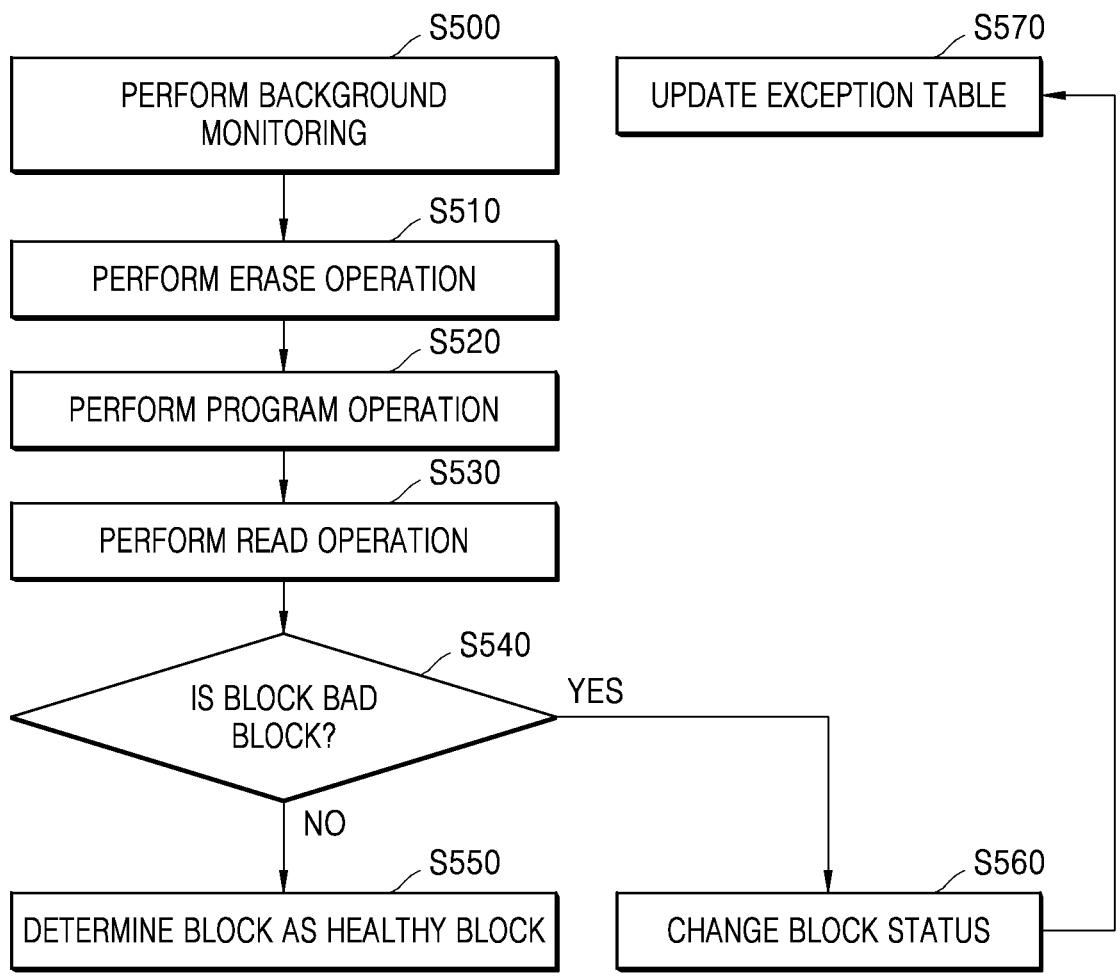
FIG. 15 is a flowchart illustrating another example of a monitoring method performed on a monitoring block according to an example embodiment of the inventive concepts.

FIG. 15 is a flowchart illustrating another example of a monitoring method performed on a monitoring block according to an example embodiment of the inventive concepts.

Referring to FIG. 15, the present example embodiment may correspond to a background monitoring method performed on the monitoring block. For example, the monitoring method according to the present example embodiment may correspond to another example of operation S150 in FIG. 5. For example, the monitoring method according to the present example embodiment may include operations time serially performed by the memory controller 110 of FIG. 1. Hereinafter, the monitoring method according to the present example embodiment will be described with reference to FIGS. 1 and 15.

In operation S500, the controller 110 may perform background monitoring on the monitoring block. For example, the controller 110 may perform background monitoring on the free block BLK9 included in the monitoring die 500 of FIG. 12. In operation S510, an erase operation may be performed on the monitoring block. Also, operation S510 may include an erase verification operation performed after the erase operation. In operation S520, a program operation may be performed on the monitoring block. For example, dummy data may be programmed in a block. Also, operation S520 may include a program verification operation performed after the program operation. In operation S530, a read operation may be performed on the monitoring block. Also, operation S530 may include a read verification operation performed after the read operation. For example, the dummy data programmed in the block may be read. However, example embodiments of the inventive concepts are not limited thereto. In some example embodiments, at least one of operations S510 to S530 may be performed. Further, in some example embodiments, the order of operations S510 through S530 may be changed.

In operation S540, the controller 110 may determine whether the monitoring block is a bad block. For example, the controller 110 may determine whether the monitoring block is a bad block based on at least one of a result of performing the erase verification operation, a result of performing the program verification operation, and a result of performing the read verification operation. When it is determined that the monitoring block is not the bad block, operation S550 may be performed. In operation S550, the controller 110 may determine the monitoring block as a healthy block. For example, the controller 110 may maintain a status of the block BLK9 as a free block and indicate the status of the block BLK9 as the healthy block in the block status table (for example, 600 in FIG. 14).

Meanwhile, when it is determined that the monitoring block is the bad block, operation S560 may be performed. In operation S560, the controller 110 may change a block status. For example, the controller 110 may update the block status table 600 to reflect the changed block status. For example, in the block status table 600, the controller 110 may change the status of the block BLK9 to the bad block and indicate the status of the block BLK9 as a non-healthy block.

In operation S570, the controller 110 may update the exception table (e.g., 300 in FIG. 10A). The controller 110 may update the exception table according to a type of a fail occurred in operations S510 to S530. For example, when an erase fail occurs, the controller 110 may update the number of erase fails in the exception table. For example, when a program fail occurs, the controller 110 may update the number of program fails in the exception table. For example, when a read fail occurs, the controller 110 may update the number of read fails in the exception table.

Figure 16:
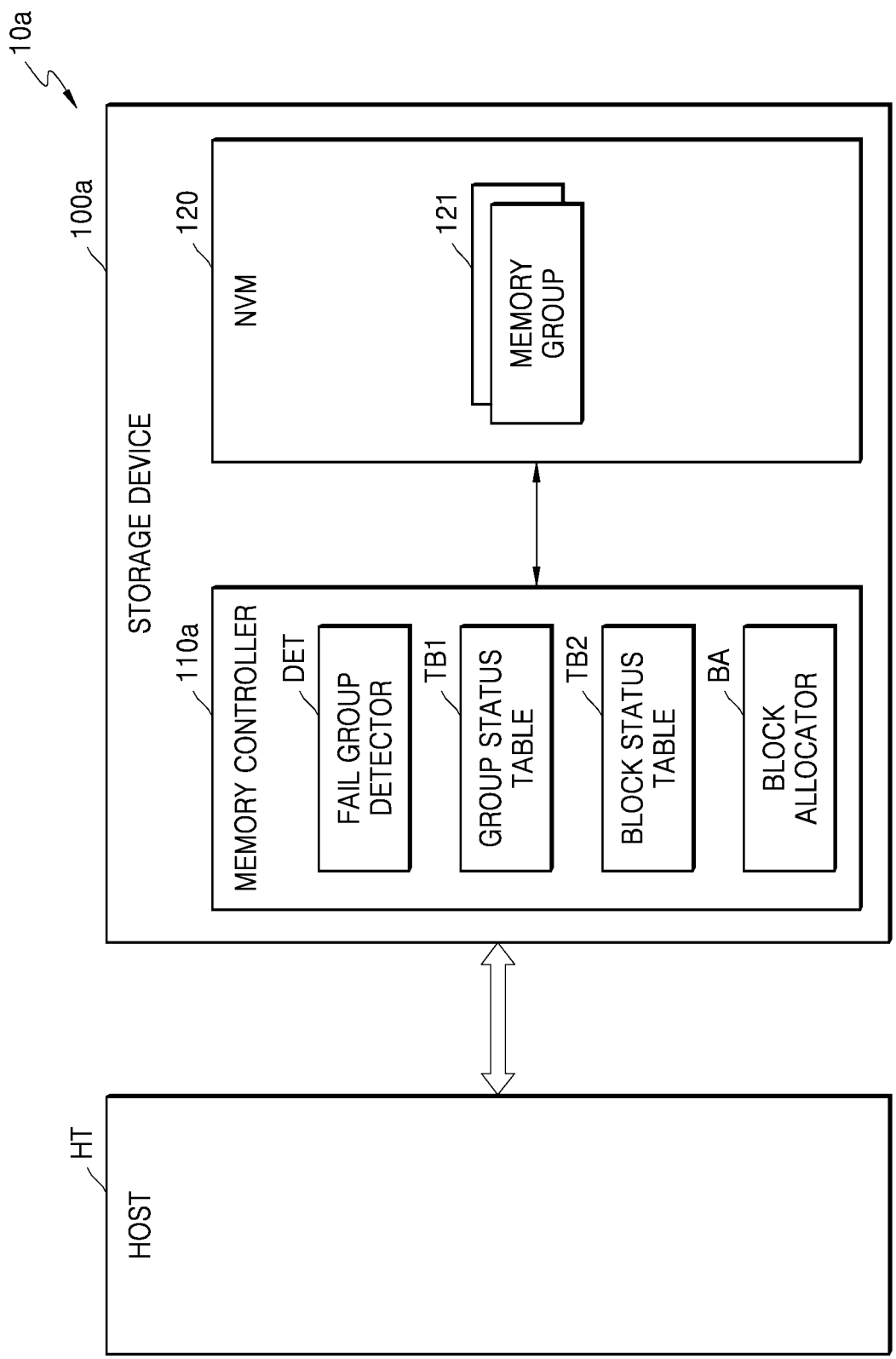
FIG. 16 is a block diagram illustrating a storage system according to an example embodiment of the inventive concepts.

FIG. 16 is a block diagram illustrating a storage system 10a according to an example embodiment of the inventive concepts.

Referring to FIG. 16, the storage system 10a may include a storage device 100a and the host HT. The storage device 100a may include a memory controller 110a and the NVM 120. The memory controller 110a may include the fail group detector DET, the group status table TB1, the block status table TB2 and a block allocator BA. The NVM 120 may include the plurality of memory groups 121. The storage device 100a according to the present example embodiment may correspond to a modification of the storage device 100 illustrated in FIG. 1. Accordingly, the descriptions provided above with reference to FIGS. 1 to 15 may be applied to the present example embodiment, and a redundant description will be omitted.

The fail group detector DET may determine a monitoring block as a bad block or a healthy block by determining the monitoring group among the plurality of memory groups 121 and performing a monitoring operation on the monitoring block among a plurality of blocks included in the monitoring group. In an example embodiment, the monitoring operation may be performed using dummy data rather than user data, thereby determining in advance a status of the monitoring block. Also, the fail group detector DET may update a result of determination to the block status table (600 in FIG. 14) with respect to the monitoring group, and determine whether the monitoring group is a fail group based on the block status table.

The block allocator BA may allocate the healthy block in the block status table as a user block for a memory operation on user data. Specifically, the block allocator BA may allocate, as a user block, a block determined as the healthy block as a result of monitoring, among monitoring blocks, i.e. free blocks or reserved blocks, in which the user data is not programmed. For example, the block allocator BA may allocate one of blocks indicated as the healthy block in the block status table 600 illustrated in FIG. 14 as the user block. On the other hand, the block allocator BA may not allocate, as the user block, a block determined as the bad block as a result of monitoring, among monitoring blocks, i.e. free blocks or reserved blocks, in which the user data is not programmed.

As described above, block utilization of the monitoring group may increase by preferentially using the healthy block among the plurality of blocks included in the monitoring group having a high fail possibility. Also, by preferentially using the healthy block among the plurality of blocks, a time at which bad blocks more than a reference number are generated in the monitoring group may be delayed, and thus a time at which the monitoring group is processed as a fail group may be delayed.

Figure 17:
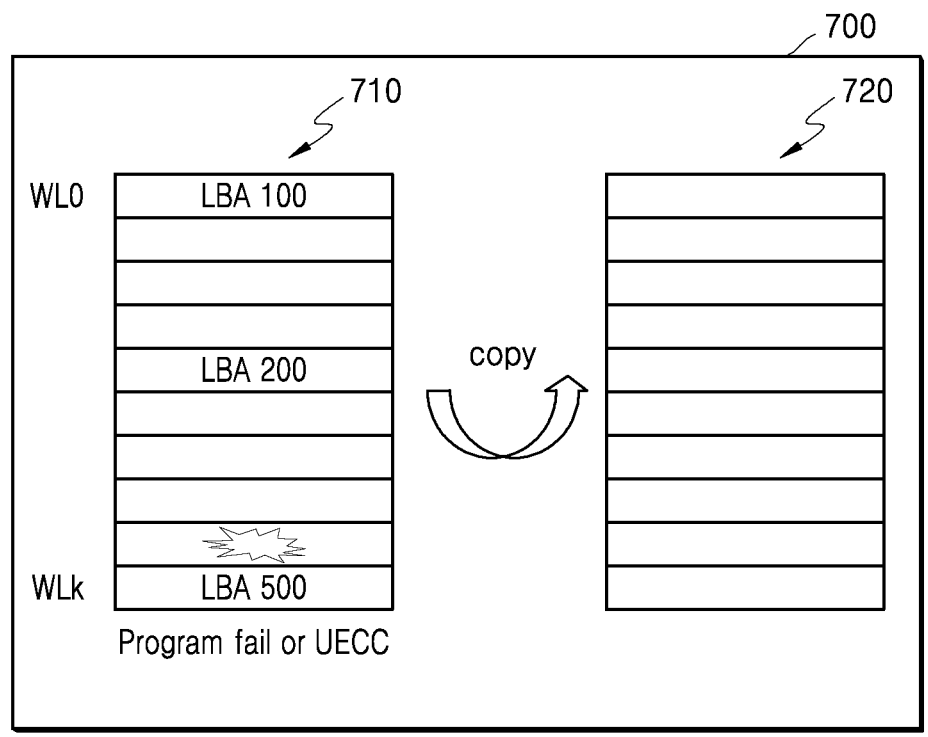
FIG. 17 illustrates a first case illustrating processing of a user block according to a comparative example of the inventive concepts and a second case illustrating processing of a monitoring block according to an example embodiment of the inventive concepts.
Figure 17:
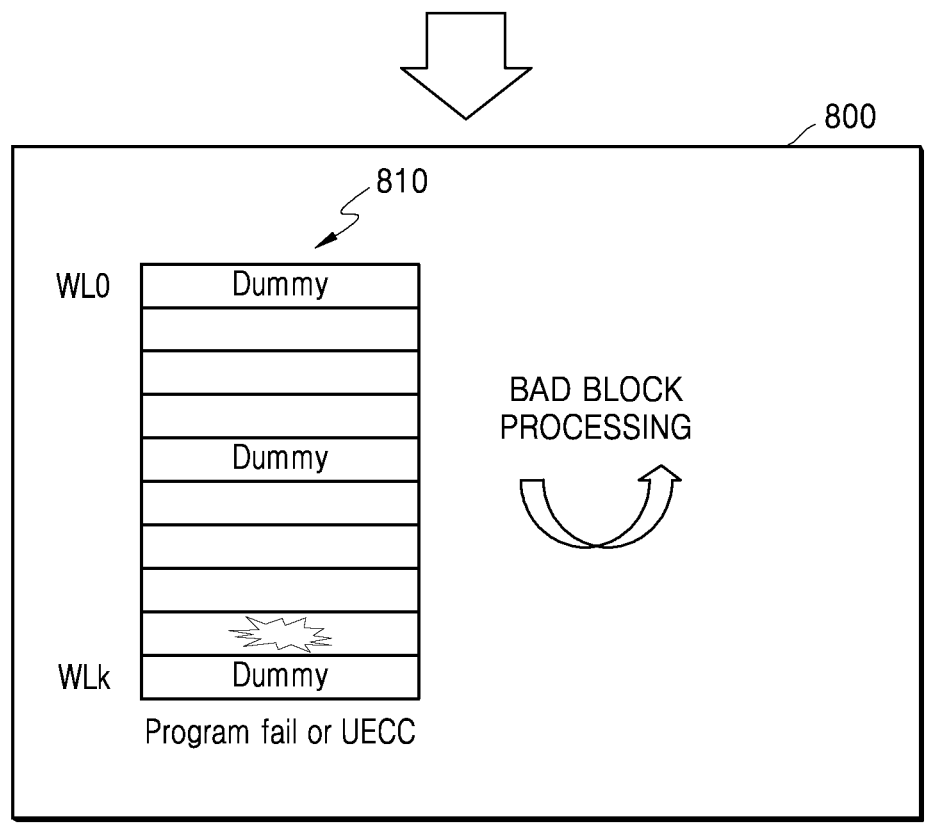

FIG. 17 illustrates a first case 700 illustrating processing of a user block 710 according to a comparative example of the inventive concepts and a second case 800 illustrating processing of a monitoring block 810 according to an example embodiment of the inventive concepts.

Referring to FIG. 17, in the first case 700 according to the comparative example of the inventive concept, the user block 710 may include valid pages in which user data is programmed. For example, user data corresponding to a first logical address LBA100 may be programmed on a word line WL0, and user data corresponding to a second logical address LBA500 may be programmed on a word line WLk. Here, k may be any positive integer. When a program fail occurs with respect to the user block 710 or a UECC occurs due to a read fail, bad block processing or bad block management may be performed on the user block 710.

Specifically, the user data programmed in the user block 710 may be copied and programmed to another block 720. At this time, bad block processing may take a considerable amount of time. When the user data is programmed to all k word lines included in the user block 710, it may take a very long time to copy the user data and program the user data to the other block 720.

However, in the second case 800 according to an example embodiment of the inventive concept, the monitoring block 810 may include dummy pages in which dummy data, rather than user data, is programmed. For example, dummy data may be programmed to the word lines WL0 to WLk. When a program fail occurs with respect to the monitoring block 810 or a UECC occurs due to a read fail, the monitoring block 810 may be processed as a bad block. However, in this case, since the dummy data programmed in the monitoring block 810 is not copied and programmed to another block, a time required for bad block processing may be significantly reduced as compared with the first case 700.

Figure 18:
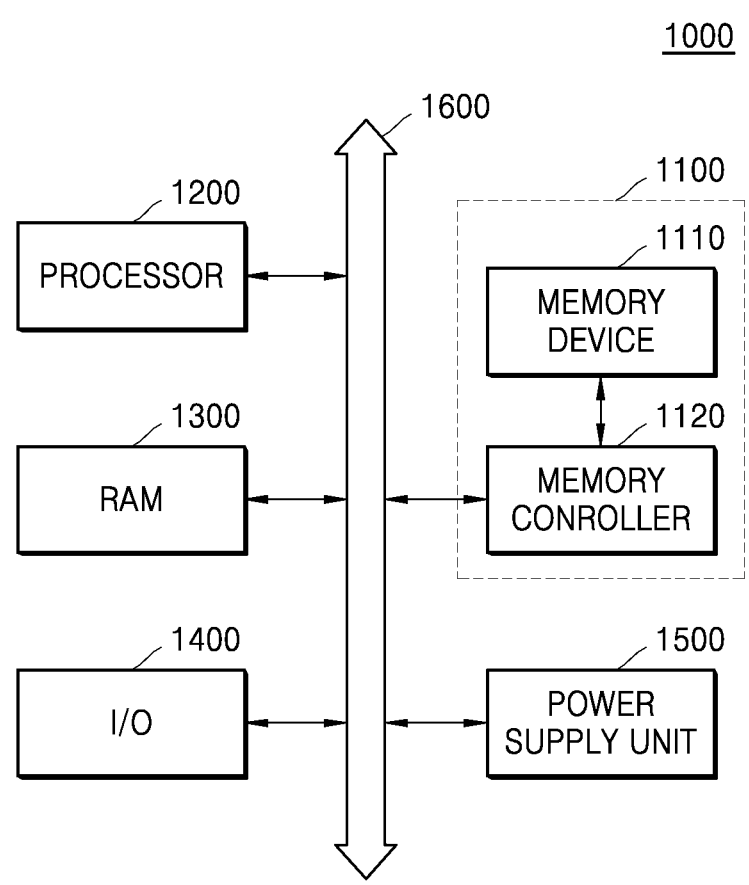
FIG. 18 illustrates a computing system according to an example embodiment of the inventive concepts.

FIG. 18 illustrates a computing system 1000 according to an example embodiment of the inventive concepts.

Referring to FIG. 18, the computing system 1000 may include a memory system 1100, a processor 1200, a RAM 1300, an input/output device 1400, and a power supply unit 1500. Meanwhile, although not shown in FIG. 18, the computing system 1000 may further include ports capable of communicating with video cards, sound cards, memory cards, USB devices, and the like, or communicating with other electronic devices. The computing system 1000 may be implemented a personal computer, or may be implemented as a portable electronic device such as a notebook computer, a mobile phone, a personal digital assistant (PDA), a camera, and the like.

The processor 1200 may perform specific calculations or tasks. According to an example embodiment, the processor 1200 may be a micro-processor or a central processing unit (CPU). The processor 1200 may communicate with the RAM 1300, the input/output device 1400, and the memory system 1100 via a bus 1600, such as an address bus, a control bus, and a data bus. At this time, the memory system 1100 may be implemented using the embodiments illustrated in FIGS. 1 to 17. For example, the memory system 1100 may include a memory device 1110 and a memory controller 1120. According to an example embodiment, the processor 1200 may also be connected to an expansion bus, such as a Peripheral Component Interconnect (PCI) bus.

The RAM 1300 may store data necessary for an operation of the computing system 1000. For example, the RAM 1300 may be implemented as a DRAM, a mobile DRAM, an SRAM, a PRAM, an FRAM, an RRAM, and/or an MRAM. The input/output device 1400 may include input means such as a keyboard, a keypad, a mouse and the like, and output means such as a printer, a display, and the like. The power supply unit 1500 may supply an operating voltage required for the operation of the computing system 1000.

While the inventive concepts have been particularly shown and described with reference to some example embodiments thereof, it will be understood that various changes in form and details may be made therein without departing from the spirit and scope of the following claims.

What is claimed is:

1. A storage device comprising:
   a non-volatile memory including a plurality of memory groups; and
   a memory controller configured to,
      determine a monitoring group from among the plurality of memory groups,
      determine a monitoring block from among a plurality of blocks included in the monitoring group,
      monitor the monitoring block using dummy data to determine whether the monitoring block is a bad block or a healthy block, and
      determine whether the monitoring group is a fail group prior to failure of the monitoring group based on a number of the bad blocks included in the monitoring group,
      wherein the plurality of memory groups include one or more of a plurality of memory chips and a plurality of memory dies.

2. The storage device of claim 1, wherein the memory controller is configured to monitor the monitoring block by,
   performing a memory operation on the monitoring block, the memory operation including at least one of an erase operation, a program operation, and a read operation, and
   determining whether the monitoring block is a bad block based on a result of the memory operation.

3. The storage device of claim 1, wherein the memory controller is further configured to determine whether the monitoring group is the fail group by,
   updating a block status table with respect to the monitoring group based on whether the monitoring block is the bad block or the healthy block, and
   determining whether the monitoring group is the fail group based on the block status table.

4. The storage device of claim 3, wherein the memory controller is further configured to allocate the healthy block as a user block for a memory operation on user data.

5. The storage device of claim 1, wherein a memory operation includes consecutively performing an erase operation, a program operation, and a read operation, and the memory controller is configured to determine one of the plurality of memory groups where a fail occurs with respect to the memory operation as the monitoring group.

6. The storage device of claim 1, wherein the memory controller is configured to determine one of the plurality of memory groups having a number of fails of a memory operation being greater than or equal to a first reference value and less than a second reference value as the monitoring group, the second reference value being greater than the first reference value, the memory operation including at least one of an erase operation, a program operation, and a read operation.

7. The storage device of claim 6, wherein the memory controller is further configured to,
   determine one of the plurality of memory groups having the number of fails equal to or greater than the second reference value as the fail group, and
   determine one of the plurality of memory groups having the number of fails less than the first reference value as a normal group.

8. The storage device of claim 1, wherein the memory controller is further configured to determine one of the plurality of blocks that does not include a valid page on which valid data is programmed as the monitoring group.

9. The storage device of claim 1, wherein the monitoring block is a reserved block or a free block.

10. The storage device of claim 1, wherein when a block for a memory operation for user data is allocated as an allocated block, the memory controller is further configured to, determine whether the allocated block is included in the monitoring group, and monitor the allocated block, when the allocated block is included in the monitoring group.

11. The storage device of claim 1, wherein the memory controller is configured to monitor the monitoring block at an idle time.

12. The storage device of claim 1, wherein the memory controller is configured to monitor the monitoring block by monitoring a portion of pages included in the monitoring block.

13. The storage device of claim 1, wherein the memory controller is configured to monitor the monitoring block by monitoring all pages included in the monitoring block.

14. A memory controller comprising:
a memory; and
a processor configured to,
determine a monitoring group from among a plurality of memory groups, the monitoring group including bad blocks and/or healthy blocks,
determine a monitoring block from among a plurality of blocks included in the monitoring group,
monitor the monitoring block to determine whether the monitoring block is a bad block or a healthy block,
determine whether the monitoring group is a fail group based on a number of the bad blocks included in the monitoring group, and
allocate one of the healthy blocks as a user block for a memory operation on user data.

15. The memory controller of claim 14, wherein the memory controller is configured to monitor the monitoring block by, performing the memory operation on the monitoring block, the memory operation including at least one of an erase operation, a program operation, and a read operation, and determining whether the monitoring block is one of the bad blocks based on a result of the memory operation.

16. The memory controller of claim 14, wherein the monitoring block is a reserved block or a free block.

17. A memory controller comprising:
a memory storing a plurality of block status tables corresponding to different ones of a plurality of memory groups; and
a processor configured to,
determine a monitoring group from among the plurality of memory groups,
determine a monitoring block from among a plurality of blocks included in the monitoring group,
monitor the monitoring block using dummy data to generate a result,
update a first block status table corresponding to the monitoring group from among the plurality of block status tables based on the result, and
determine whether the monitoring group is a fail group based on the first block status table prior to failure of the monitoring group.

18. The memory controller of claim 17, wherein the processor is configured to monitor the monitoring block by,
performing a memory operation on the monitoring block to generate the result, the memory operation including at least one of an erase operation, a program operation, and a read operation, and
determining whether the monitoring block is a bad block based on the result.

* * * * *